United States Patent
Litmanen

(10) Patent No.: US 7,586,376 B2
(45) Date of Patent: Sep. 8, 2009

(54) PRE-POWER AMPLIFIER OF LOAD, SWITCH ARRAY, AND IMPEDANCE COMPENSATION

(75) Inventor: Petteri M. Litmanen, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 663 days.

(21) Appl. No.: 11/292,965

(22) Filed: Dec. 1, 2005

(65) Prior Publication Data

US 2007/0129029 A1 Jun. 7, 2007

(51) Int. Cl.
*H03F 3/191* (2006.01)

(52) U.S. Cl. .................. 330/305; 330/278; 330/252; 455/127.2

(58) Field of Classification Search .............. 326/30; 455/114.3, 126–127.5; 375/296–297; 330/256, 330/259, 282, 284, 292, 311
See application file for complete search history.

(56) References Cited

U.S. PATENT DOCUMENTS

| | | | |
|---|---|---|---|
| 6,326,821 B1 * | 12/2001 | Gabara | 327/112 |
| 6,859,064 B1 * | 2/2005 | Maangat | 326/30 |
| 2002/0180547 A1 * | 12/2002 | Staszewski et al. | 332/115 |
| 2004/0008054 A1 * | 1/2004 | Lesea et al. | 326/30 |
| 2005/0287967 A1 * | 12/2005 | Hung et al. | 455/127.2 |
| 2006/0066346 A1 * | 3/2006 | Tat Lim et al. | 326/30 |
| 2006/0132230 A1 * | 6/2006 | Douglas | 330/2 |

* cited by examiner

*Primary Examiner*—James Cho
*Assistant Examiner*—Jany Tran
(74) *Attorney, Agent, or Firm*—Lawrence J. Bassuk; W. James Brady; Frederick J. Telecky, Jr.

(57) ABSTRACT

A novel and useful load compensation circuit and associated pre-power amplifier constructed therefrom. The load compensation circuit functions to maintain a nearly constant output impedance of the pre-power amplifier by use of a switch matrix comprising a plurality of transistors. The switch matrix is placed in parallel with the output of the pre-power amplifier (PPA). Transistors are turned on or off within the load compensation switch matrix so as to maintain a nearly constant output impedance of the PPA throughout the entire modulation range. At maximum PPA output power, all transistors in the load compensation switch matrix are turned off thereby minimizing the extra output loading and reducing the overall power output. As output power decreases, additional numbers of transistors in the load compensation switch matrix are turned on so as to maintain a constant output impedance of the PPA.

5 Claims, 8 Drawing Sheets

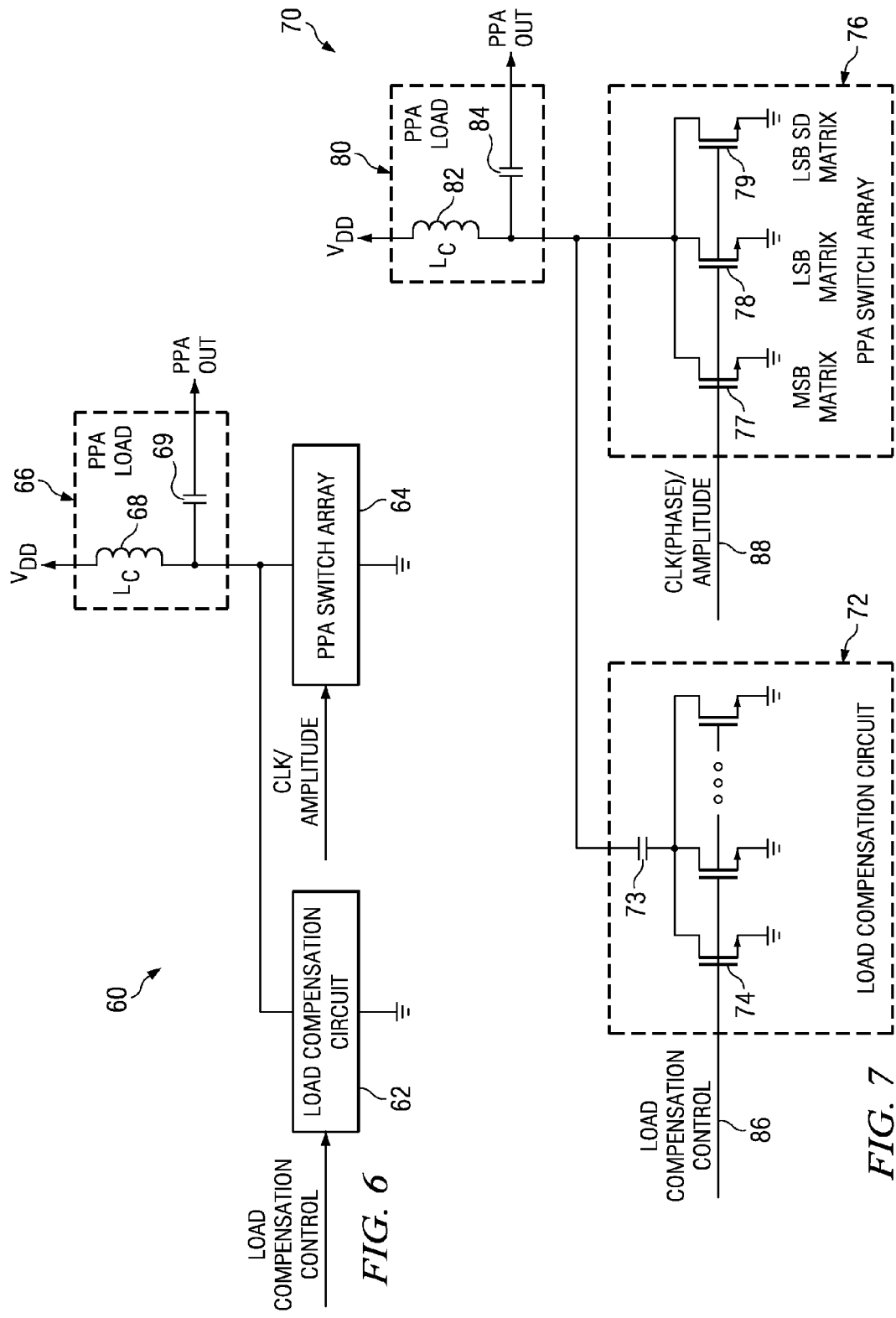

PRE-POWER AMPLIFIER OF LOAD, SWITCH ARRAY, AND IMPEDANCE COMPENSATION

FIELD OF THE INVENTION

The present invention relates to the field of data communications and more particularly relates to a load compensation circuit and a pre-power amplifier incorporating the load compensation circuit suitable for use in the transmitter portion of a Digital RF Processor or Digital Radio Processor (DRP).

BACKGROUND OF THE INVENTION

It is well known in the communication arts that a transmit (Tx) buffer is required for both wired and wireless communications systems to interface the transmit path signal to the outside environment. In many cases, the transmit buffer is required to apply a variable gain to the transmit signal in order to increase or reduce the amplitude of the output signal. One such case occurs when the transmitted signal is part of an amplitude modulated communication system and the transmit buffer itself is used to implement the amplitude modulation function. The signal to noise ratio (SNR) requirements of such Tx buffers in most systems are extremely strict, meaning that any amplitude control circuitry should contribute no more than negligible noise to the buffer output. The reverse isolation (which can also be considered gain accuracy at low gain levels) of such transmit buffers is also an important concern. In addition, the current consumption requirements for these transmit buffers are limited such that any gain control scheme cannot 'bum' or waste current in order to meet the power consumption budget and the strict signal to noise requirements stated above.

A prior art digitally controlled near class E power amplifier designed for the Bluetooth wireless communication standard provides a limited number of bits for amplitude control (e.g., only 3.5 bits of amplitude control) and is used for power regulation of the transmitted constant envelope RF output. The previous lowest reported power consumption for a prior art GSM transmit chain, having no power control, is 17 mW with −7 dBm output power. The design for such a system has a transmitted power efficiency of 2.7% for an output power of 0 dBm.

There exist in the prior art multiple transmit chain architectures for transforming a digitally encoded bit stream into an RF modulated waveform at a power level suitable for transmission. The transmit power level for a cellular transceiver integrated circuit (IC) is typically around 3 dBm for interfacing with external power amplifiers (PAs). This output power level, however, is not constant in amplitude-modulated standards, such as EDGE, and must be controlled with appropriate variable-gain circuitry. Typical prior art architectures, such as single-sideband upconversion, perform digital-to-analog conversion on-chip and employ a variable gain pre-power amplifier (PPA) to transmit the required signal at the desired power level. In these architectures, the overall power consumption of the transmit chain, including all the DAC and variable gain buffer components, is at least 50 mW which is a relatively high amount of power. It is desirable to be able to reduce the power consumption of the transmit chain significantly.

All digital CMOS pre-power amplifiers exist in the art. A pre-power amplifier is designed to generate an output signal having desired waveform characteristics that is fed into the final power output stage before being transmission over the wireless channel. In a CMOS RF transmitter, the pre-power amplifier (typically the last buffer stage) functions as an RF digital to analog converter (DAC) followed by an analog high power buffer. The pre-power amplifier power is varied by switching the transistors in the PPA switch array on and off. This, however, causes the output load to vary as well. The changes in impedance between full on and off can be extreme resulting in very high impedance mismatch between the source and the load. The impedance mismatch phenomenon does not affect the performance of the PPA but it severely impact the performance of the SAW filter that follows the PPA or the performance of the power amplifier if no SAW filter is used.

There is thus a long felt need for a pre-power amplifier incorporating a load compensation circuit that is able to maintain a nearly constant output impedance across the entire output range of the pre-power amplifier from the minimum code to the maximum code. In addition, the pre-power amplifier should be able to be implemented using digital CMOS processes.

SUMMARY OF THE INVENTION

The present invention provides a solution to the problems of the prior art by providing a load compensation circuit and pre-power amplifier constructed therefrom. The load compensation circuit and associated pre-power amplifier are presented in the context of an all digital direct digital-to-RF amplitude converter (DRAC), which efficiently combines the traditional transmit chain functions of upconversion, I and Q combining, D/A conversion, filtering, buffering and RF output amplitude control into a single circuit.

The load compensation circuit functions to maintain a nearly constant output impedance of the pre-power amplifier sufficient to enable implementation of more demanding wireless standards, such as WCDMA and CDMA2000, using digital CMOS processes.

Load compensation is achieved by the present invention by use of a switch matrix comprising a plurality of elements (i.e. transistors). The switch matrix is placed in parallel with the output of the pre-power amplifier (PPA). Transistors are turned on or off within the load compensation switch matrix such that the output impedance of the PPA remains nearly constant throughout the entire modulation range, i.e. from a minimum MSB code of 0 through a maximum MSB code of 256.

The amplitude output of the PPA is generated by a switch array. The number of elements in the switch array turned on is determined in accordance with an amplitude control word. As the number of transistors turned on increases, output loading increases. At small output power levels, output loading is at a minimum. Load compensation is achieved by turning on transistors in the load compensation switch matrix which is coupled to the output of the PPA. At maximum PPA output power, all transistors in the load compensation switch matrix are turned off thereby minimizing the extra output loading and reducing the overall power output. As output power decreases, additional numbers of transistors in the load compensation switch matrix are turned on so as to maintain a constant output impedance of the PPA.

Note that many aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a load compensation circuit comprising a switch matrix and load control means coupled to the switch matrix, the load control means operative to vary the amount of load coupled to the output of a circuit in accordance with a load control signal such that the output impedance of the circuit is maintained at a substantially constant value.

There is also provided in accordance with the invention, a pre-power amplifier comprising a load coupled to a power source, a switch array comprising a plurality of switches, the switch array for generating a current proportional to the number of switches active therein and a load compensation circuit coupled to the switch array, the load compensation circuit operative to vary the load coupled to the output of the pre-power amplifier in accordance with a load control signal such that the output impedance of the pre-power amplifier is maintained at a substantially constant value.

There is further provided in accordance with the invention, a pre-power amplifier comprising a load coupled to a power source, a switch array comprising a plurality of switches, the switch array for generating a current proportional to the number of switches active therein, a load compensation circuit coupled to the switch array, comprising a switch matrix and load control means coupled to the switch matrix, the load control means operative to vary the amount of load coupled to the output of the pre-power amplifier in accordance with a load control signal such that the output impedance of the circuit is maintained at a substantially constant value.

There is also provided in accordance with the invention, a pre-power amplifier comprising a load coupled to a power source, a switch array comprising a plurality of switches, the switch array for generating a current proportional to the number of switches active therein and load compensation means coupled to the switch array for varying the amount of load coupled to the output of the pre-power amplifier in accordance with a load control signal such that the output impedance of the circuit is maintained at a substantially constant value.

BRIEF DESCRIPTION OF THE DRAWINGS

The invention is herein described, by way of example only, with reference to the accompanying drawings, wherein:

FIG. 6 is a circuit diagram illustrating an example embodiment of a pre-power amplifier incorporating the load compensation circuit of the present invention;

FIG. 7 is a circuit diagram illustrating an example embodiment of the pre-power amplifier of the present invention in more detail;

DETAILED DESCRIPTION OF THE INVENTION

Notation Used Throughout

Figure 1:
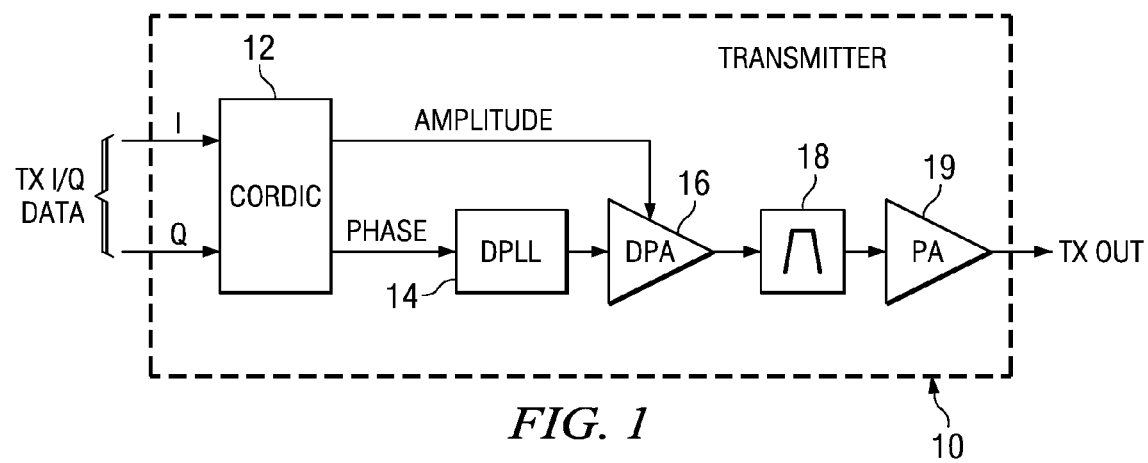
FIG. 1 is a block diagram illustrating an example embodiment of a polar transmitter and DRAC incorporating the load compensation circuit of the present invention.

The following notation is used throughout this document.

| Term | Definition |
| --- | --- |
| ASIC | Application Specific Integrated Circuit |
| CDMA | Code Division Multiple Access |
| CMOS | Complementary Metal Oxide Semiconductor |
| DAC | Digital to Analog Converter |
| DC | Direct Current |
| DCO | Digital Controlled Oscillator |
| DEM | Dynamic Element Matching |
| DPA | Digital Power Amplifier |
| DPLL | Digital Phase Locked Loop |
| DRAC | Digital to RF Amplitude Converter |
| DRP | Digital RF Processor or Digital Radio Processor |
| DSP | Digital Signal Processor |
| EDGE | Enhanced Data rates for Global Evolution |
| FPGA | Field Programmable Gate Array |
| GSM | Global System for Mobile Communication |
| IC | Integrated Circuit |
| LSB | Least Significant Bit |
| LUT | Look Up Table |
| MSB | Most Significant Bit |
| NMOS | n-channel Metal Oxide Semiconductor |
| PA | Power Amplifier |
| PMOS | p-channel Metal Oxide Semiconductor |
| PPA | Pre-Power Amplifier |
| PVT | Process Voltage Temperature |
| RF | Radio Frequency |
| SAW | Surface Acoustic Wave |
| SD | Sigma Delta |
| SNR | Signal to Noise Ratio |
| WCDMA | Wideband Code Division Multiple Access |

DETAILED DESCRIPTION OF THE INVENTION

The present invention is a load compensation circuit and pre-power amplifier constructed therefrom. The pre-power amplifier comprising the load compensation circuit is suitable for use with more demanding wireless standards such as WCDMA and CDMA2000. The invention is intended for use in a digital radio transmitter and receiver but can be used in other applications as well, such as a general communication channel. The present invention provides a solution to the problems of the prior art by providing a load compensation scheme for a pre-power amplifier within a transmitter. The load compensation circuit is presented in the context of an all digital direct digital-to-RF amplitude converter (DRAC) or pre-power amplifier (PPA), which efficiently combines the traditional transmit chain functions of upconversion, I and Q combining, D/A conversion, filtering, buffering and RF output amplitude control into a single circuit.

To aid in understanding the principles of the present invention, the description is provided in the context of a digital to RF amplitude converter (DRAC) that serves as the final stage of an all-digital polar transmitter IC for WCDMA/CDMA2000. It is appreciated by one skilled in the art that the load compensation circuit and pre-power amplifier of the present invention can be adapted to comply with numerous wireless communications standards such as GSM, extended data rate Bluetooth, WCDMA, CDMA2000, etc. It is appreciated, however, that the invention is not limited for use with any particular communication standard (wireless or otherwise) and may be used in optical, wired and wireless applications. Further, the invention is not limited for use with a specific modulation scheme but is applicable to other modulation schemes as well.

The term pre-power amplifier (PPA) is intended to include a transmit buffer as well as various amplifier circuits such as digital to RF amplitude converter (DRAC), digital power amplifier (DPA), transmit buffer, low power amplifier, high power amplifier, etc. and it not intended to be limited by the amount of power produced.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof.

A block diagram illustrating an example embodiment of a polar transmitter and DRAC incorporating the load compensation circuit of the present invention is shown in FIG. 1. The digital polar transmitter, generally referenced 10, comprises a cordic 12, digital phase locked loop (DPLL) 14, digital power amplifier (DPA) 16, bandpass filter 18 which may comprise a SAW filter and power amplifier 19.

In digital polar transmission, the I and Q data signals are converted by the cordic into amplitude and phase signals in the polar domain. The amplitude signal undergoes further digital processing in the digital portion (not shown) of the polar transmitter. The phase signal is input to the DPLL which incorporates a digitally controlled oscillator (DCO) for upconversion of the input phase signal. The processed amplitude signal and the phase signal output from the DPLL are both input to the DPA. The DPA functions to combine the digital amplitude and upconverted phase information into an analog transmit signal. The DPA also incorporates $\Sigma\Delta$ (sigma-delta) modulation to enhance the amplitude resolution and to achieve noise spectral shaping. The DRAC also performs dynamic element matching (DEM) to enhance time-averaged linearity. The SAW or other type of filter functions to suppress out of band PPA thermal and quantization noise before final amplification by the power amplifier.

Figure 2:
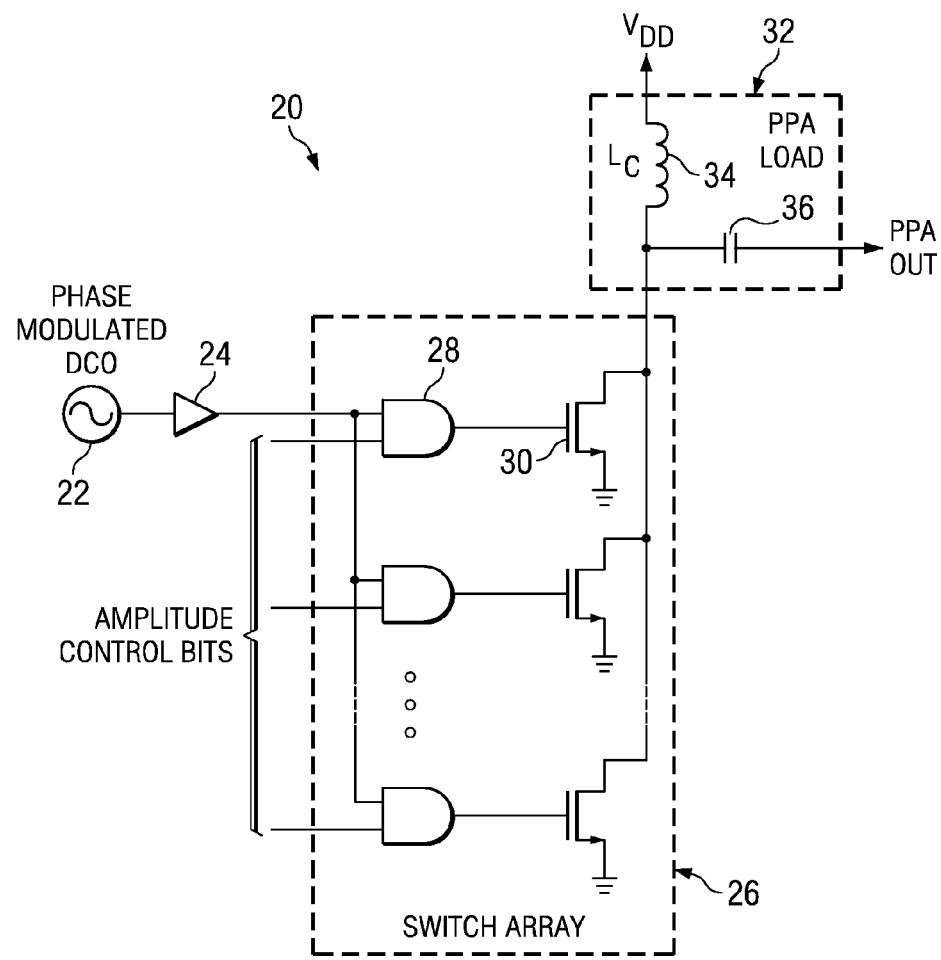
FIG. 2 is a circuit diagram illustrating a pre-power amplifier utilizing a switch array without load compensation.

A circuit diagram illustrating a pre-power amplifier utilizing a switch array but without load compensation is shown in FIG. 2. The DRAC or pre-power amplifier (PPA), generally referenced 20, comprises a load 32 and PPA switch array 26. The load comprises an RF choke 34 ($L_C$) and DC coupling capacitor 36. The switch array comprises a plurality of N pass-gate type AND gates 28 and a plurality of N output devices 30 (NMOS devices in this example). The PPA operates as a pseudo class E type amplifier and is driven by a transmit chain signal comprising the square wave signal output of DCO 22 and buffer 24. The PPA being a class E buffer, no DC bias current is required, unlike class A, class AB, class C or class D. The square wave signal is the phase modulated signal from the digital PLL (DPLL) 14 described supra and shown in FIG. 1. The N NMOS transistors are operative as on/off switches. An RF choke ($L_C$) functions as a bi-directional current source, connecting the NMOS switches to the on-chip supply voltage regulator ($V_{DD}$). The switch array is driven by digital amplitude control bits/word/code. The buffer draws current from an external matching network (not shown). In this manner, the buffer generates an analog voltage waveform at its output. A more detailed description of the structure and operation of the PPA 20 can be found in U.S. application Ser. No. 11/115,815, filed Apr. 26, 2005, entitled "Low Noise High Isolation Transmit Buffer Gain Control Mechanism", incorporated herein by reference in its entirety.

Figure 3:
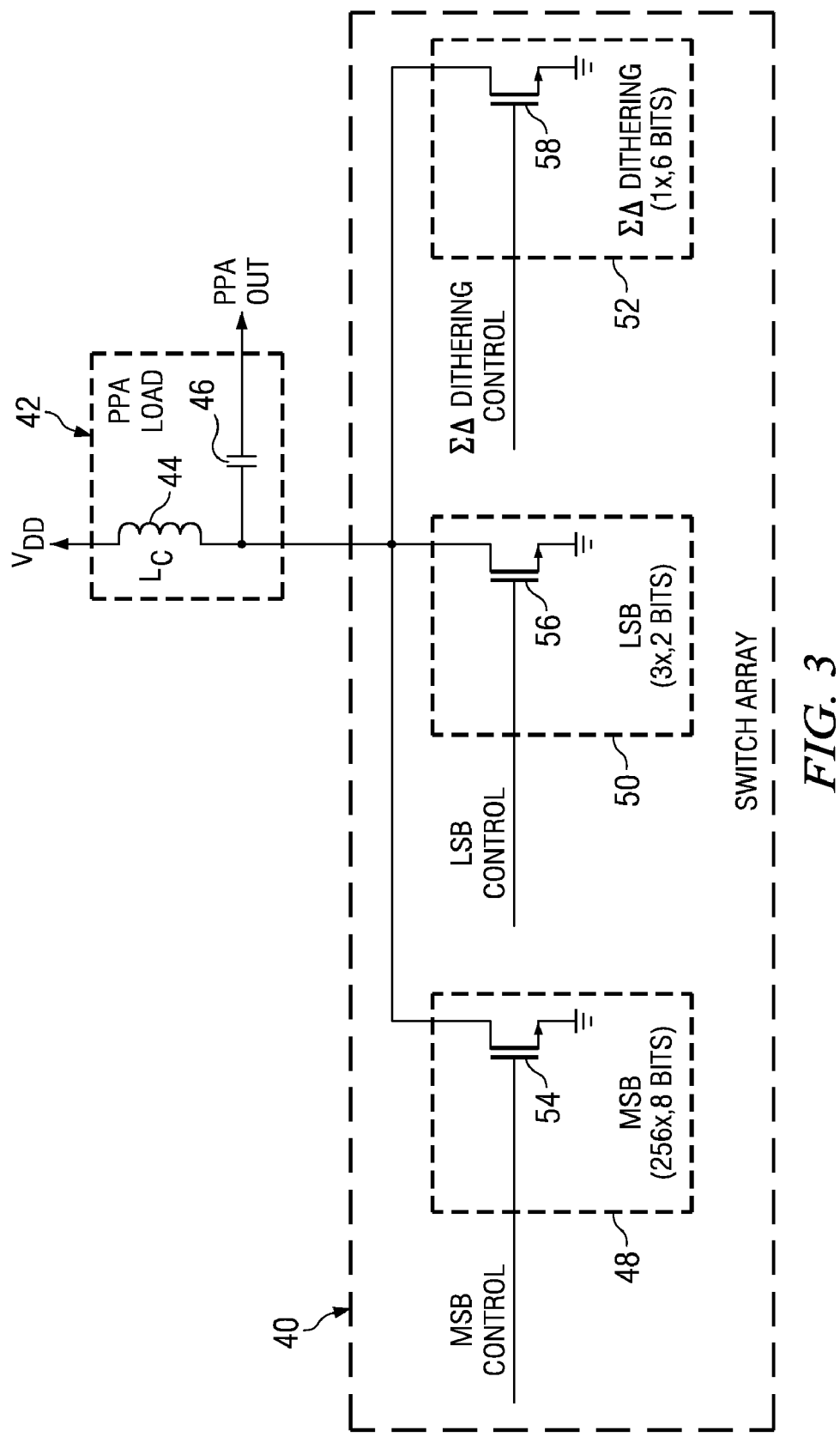
FIG. 3 is a circuit diagram illustrating an example embodiment of the switch array of FIG. 2 in more detail.

A circuit diagram illustrating an example embodiment of the PPA switch array of FIG. 2 in more detail is shown in FIG. 3. In this example embodiment, the PPA comprises a load 42 and switch array 40. The load comprises an RF choke 44 ($L_C$) and DC coupling capacitor 46. The switch array is constructed from a plurality of transistor cell arrays or matrices. In this example, three matrices are used, namely an MSB matrix 48 comprising 256 cells 54 and 8-bit control word (only a single cell is shown for clarity), an LSB matrix 50 comprising 3 cells 56 and 2-bit control word and a sigma-delta dithering matrix 52 comprising 1 cell 58 and 1-bit control word. The transistors making up each matrix are either turned on or off in accordance with their respective control signal. The number of transistors on at any point in time within each matrix determines the amount of current contributed to the output by that matrix.

Figure 4:
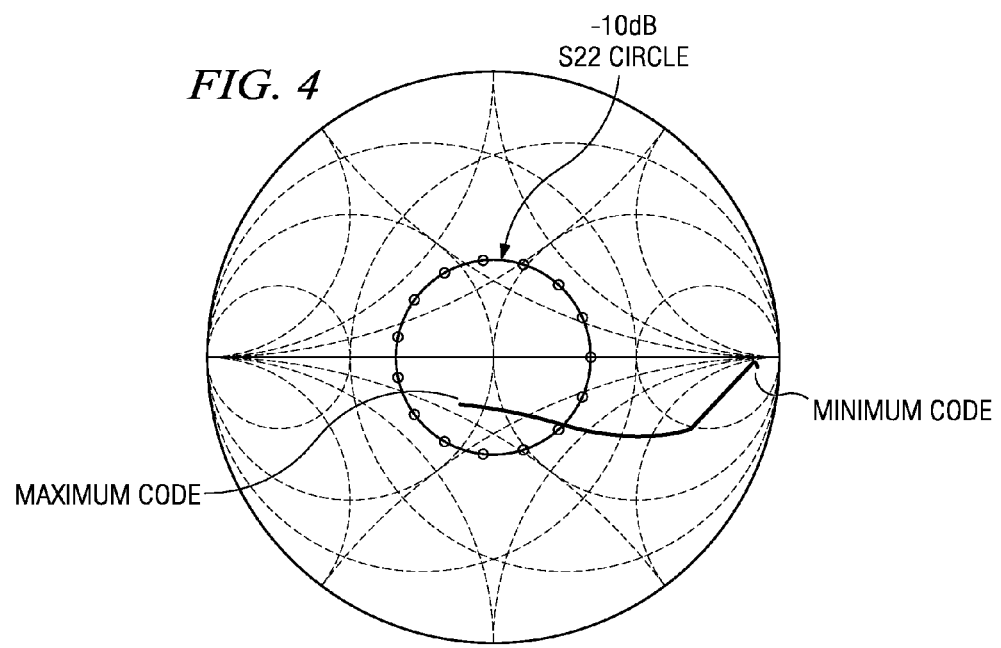
FIG. 4 is a graph illustrating the output impedance of the digital pre-power amplifier without the load compensation circuitry of the present invention.

A graph illustrating the output impedance of the digital pre-power amplifier without the load compensation circuitry of the present invention is shown in FIG. 4. As shown in FIG. 4, the uncompensated pre-power amplifier output impedance varies widely from the minimum code to the maximum code. This is due to the different number of active devices in the switch array being on at any point in time. The number of devices turned on corresponds to the desired PPA output amplitude. At low output amplitude, few devices are on and resulting in a minimum impedance mismatch. At high output amplitude, however, many devices are on resulting in a larger impedance mismatch.

Figure 5:
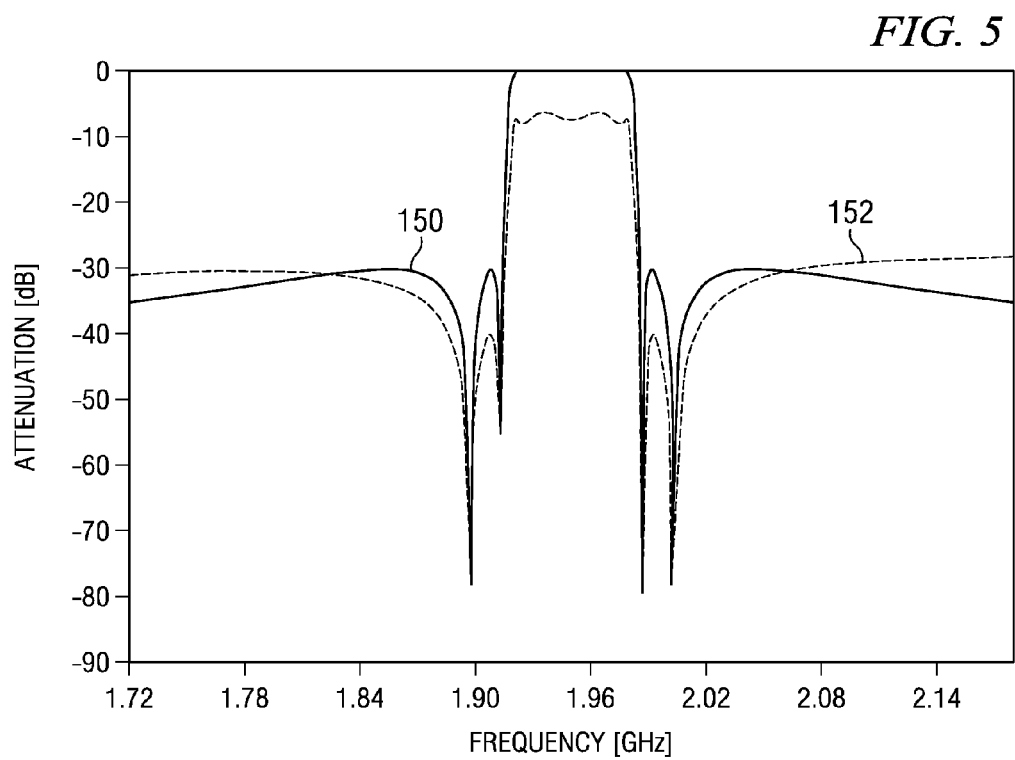
FIG. 5 is a diagram illustrating both ideal and mismatched SAW filter attenuation.

The resultant impedance mismatch severely reduces the performance of the subsequent stage. In the case of a subsequent SAW filter, the impedance mismatch causes a severe degradation of performance of the SAW filter from the ideal response, as shown in FIG. 5 which illustrates both ideal (trace 150) and mismatched (trace 152) SAW filter attenuation. The SAW filter output impedance reflects changes in the PPA output impedance which may potentially violate the impedance requirements of next stage power amplifier. In the case no SAW filter is used (i.e. PPA output is fed directly to the analog power amplifier), the impedance mismatch results in signal insertion losses which may cause the transmitter to transmit a signal that is not compliant with the particular wired or wireless communication standard.

The present invention provides a solution to this problem by providing a load compensation circuit that functions to dynamically vary its impedance such that the output impedance of the circuit it is coupled to (e.g., the PPA) is maintained at a substantially constant value. Alternatively, the load compensation circuit can be adapted to permit some variation in output impedance depending on the particular application. It is appreciated that the load compensation circuit can be used any circuit whose impedance varies with output amplitude. To aid in understanding the principles of the present invention, the load compensation circuit is described as applied to an example pre-power amplifier. It is not intended, however, that the invention be limited to use in a pre-power amplifier, as the load compensation circuit can be used in numerous other circuits as well without departing from the scope of the invention.

A circuit diagram illustrating an example embodiment of a pre-power amplifier incorporating the load compensation circuit of the present invention is shown in FIG. 6. The PPA, generally referenced 60, comprises a load 66, load compensation circuit 62 and PPA switch array 64. The load comprises an RF choke 68 ($L_C$) and DC coupling capacitor 69. The load compensation circuit receives a load compensation control signal as input while the PPA switch array receives clock and amplitude signals as input. The load compensation circuit functions to adjust its impedance so that the overall output impedance as seen by the next downstream stage is substantially constant regardless of the output amplitude generated by the PPA switch array. The load compensation control signal determines the load impedance generated by the load compensation circuit. The operation of the load compensation circuit is described in more detail infra.

The switch array is made up of transistor cells having a certain minimum size. As described supra, the impedance of the switch array varies depending on the amplitude control code input to the switch array resulting in an impedance mismatch with the subsequent stage processing (e.g., SAW filter or power amplifier both of which should optimally see a constant output impedance). The load compensation circuit functions to compensate for this impedance mismatch in accordance with the input load compensation control signal. Note that the switch matrix may comprise any suitable circuit that is capable of generating a current or voltage in proportion to an input amplitude control word.

A circuit diagram illustrating an example embodiment of the pre-power amplifier of the present invention in more detail is shown in FIG. 7. The PPA, generally referenced 70, comprises a load 80, load compensation circuit 72 and PPA switch array 76. The load comprises an RF choke 82 ($L_C$) and DC coupling capacitor 84. The PPA switch array 76 comprises MSB matrix (represented by transistor 77), LSB matrix (represented by transistor 78) and LSB sigma-delta (SD) dithering matrix (represented by transistor 79). The PPA switch array 76 is constructed similarly as the switch array 40 (FIG. 3) described in detail supra. The load compensation circuit 72 comprises a switch matrix comprising a plurality of switches 74 (i.e. transistors in this example embodiment). The switch matrix is controlled by an input load compensation control signal. The load compensation switch matrix is coupled in parallel to the output of the PPA switch array. In addition, AC coupling the switch matrix 74 to the PPA output via DC blocking capacitor 73 functions to reduce the power consumption.

Figure 8:
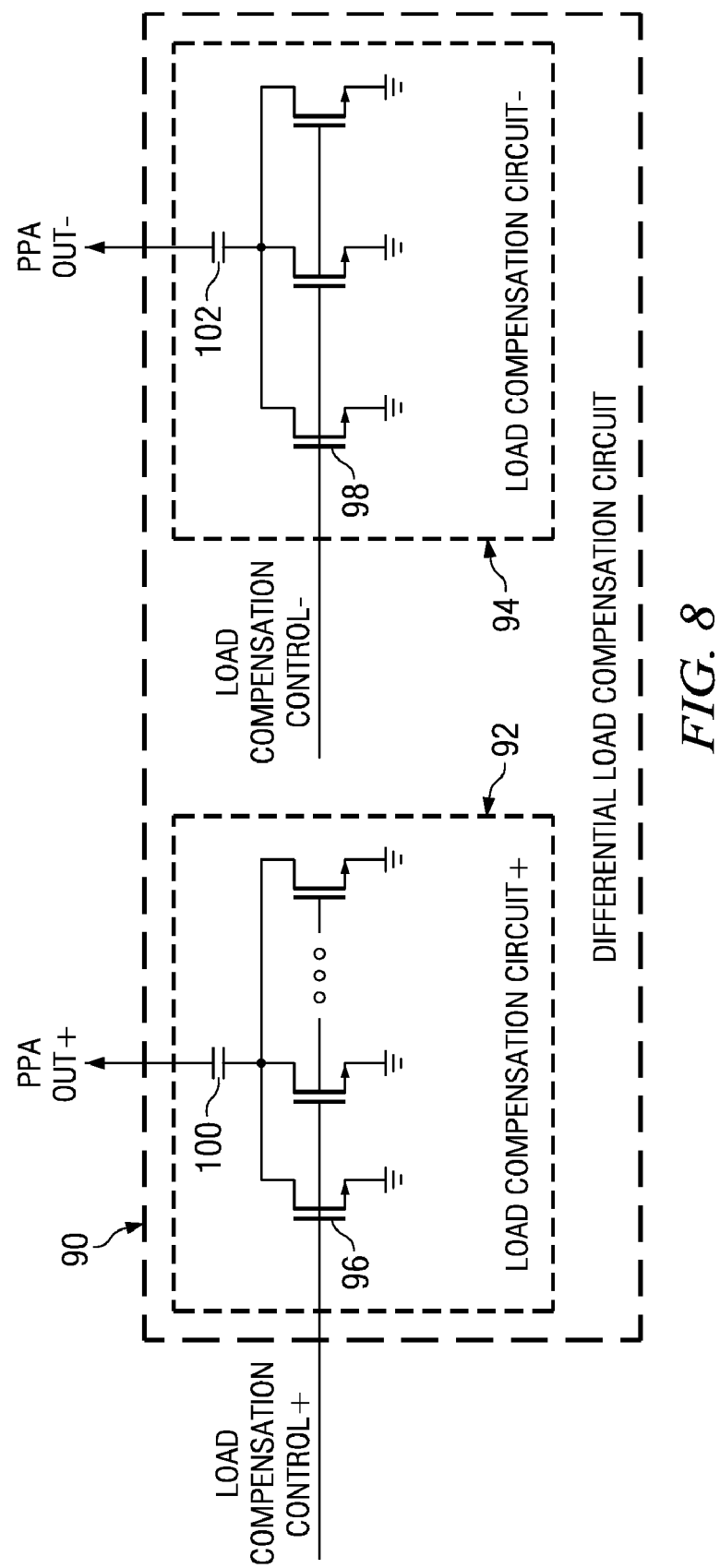
FIG. 8 is a circuit diagram illustrating an example embodiment of the differential load compensation circuit of the present invention.

A circuit diagram illustrating an example embodiment of the differential load compensation circuit of the present invention is shown in FIG. 8. In this embodiment, a pair of switch matrices is used to compensate the impedance of a differential PPA output. The differential load compensation circuit, generally referenced 90, comprises a load compensation circuit(+) 92 coupled to the PPA OUT+ and a load compensation circuit(−) 94 coupled to the PPA OUT−. Operation of each load compensation circuit 92, 94 is as described in the single-ended case.

Figure 9:
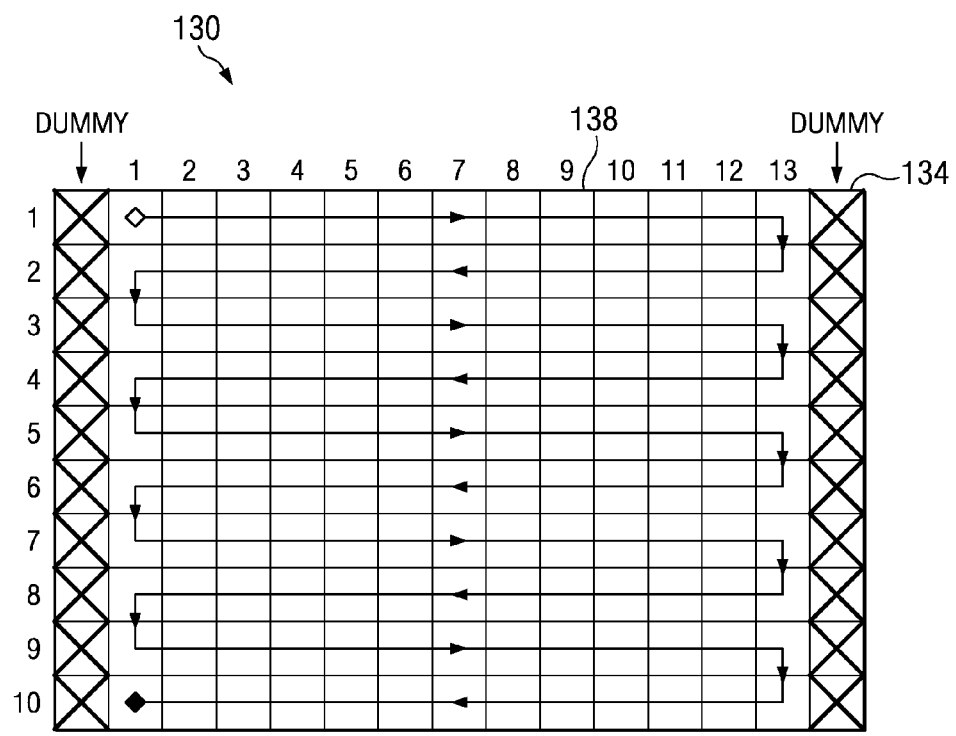
FIG. 9 is a diagram illustrating the structure and activation order of the transistor switch matrix of the load compensation circuit.

A diagram illustrating the structure and activation order of the transistor switch matrix of the load compensation circuit is shown in FIG. 9. In the example embodiment presented herein, the load compensation switch matrix is constructed as a segmented digitally controlled matrix or cell array, generally referenced 130, comprising dummy columns 132, 134 and a plurality of switch elements 138. The switch elements may comprise, for example, NMOS transistors.

An advantage of the present invention is that additional power for the load compensation circuit is not required. The output impedance of the circuit is low enough at maximum output power setting that the additional circuitry causes insignificant additional loading and power loss.

Several techniques can be used to improve dynamic element matching (DEM) from one impedance level to the next. Dynamic element matching functions to reduce device mismatch between adjacent codes whereby switching between adjacent transistors is performed in the actual implementation. By way of example only, considering the switch matrix, decreasing output power levels in the PPA switch array (i.e. fewer transistors on) translate to additional transistors being turned on in the load compensation switch matrix (i.e. increase in load impedance to compensate). To compensate for mismatches between transistors due to process, voltage and temperature (PVT), as the end of a row is reached, the path continues with the next row but in the opposite direction. Rather than returning to the beginning of the next row when the end of a row is reached, the next row below is traversed in the opposite direction. This results in the snake like path shown in FIG. 9.

Further, a column of dummy cells are placed before the beginning and after the end of each row resulting in two extra columns of transistors. Each row has its own dummy unit cell terminations which aid in reducing mismatches between devices.

In operation, the switch matrix in the load compensation circuit is controlled based on the MSB setting in the PPA switch array. At maximum output power, all elements (i.e. transistors) in the load compensation switch matrix are turned off in order to maintain the available maximum output power. At maximum output it is not desirable to add additional losses when transmitting at very high power. As the output power level decreases, additional switch elements are turned on thus maintaining constant output impedance. Any suitable means may be utilized to control the impedance generated by the load compensation circuit. In the example presented herein, the load compensation circuit generates an impedance in accordance with a predetermined look up table (LUT) wherein each MSB setting of the PPA switch array has a corresponding compensation setting.

The relationship or mapping between MSB setting of the PPA switch array and the load compensation circuit impedance setting may be realized by use of polynomial curve fitting. Polynomial curve fitting may be used to calculate the values in the LUT or used to determine the control parameters of the load compensation circuit on a dynamic basis.

Figure 10:
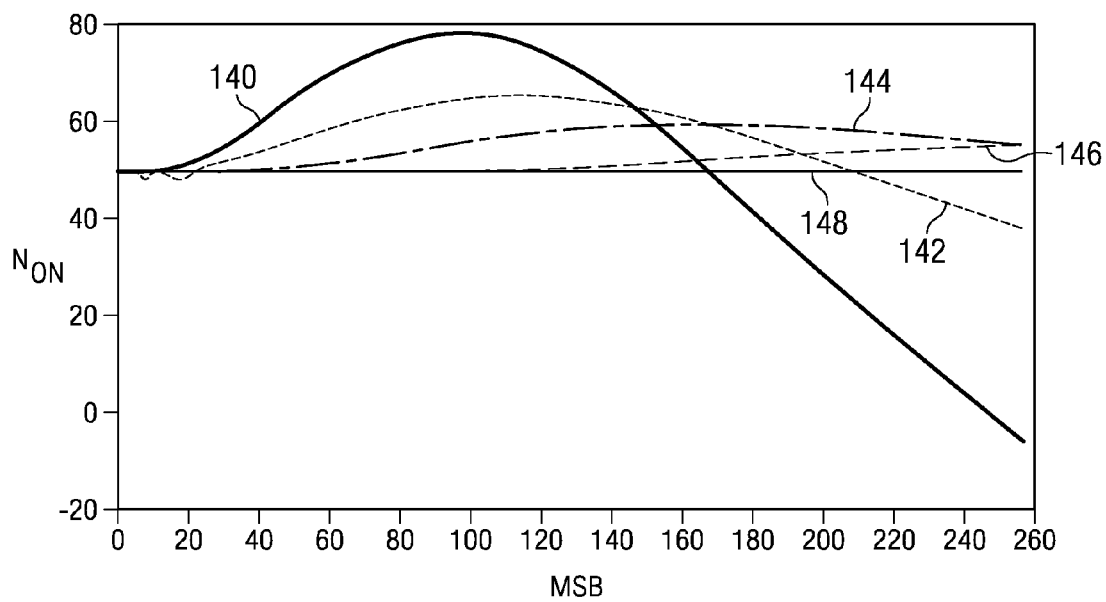
FIG. 10 is a graph illustrating the load compensation circuit control code values for various output current settings as a function of MSB.

A graph illustrating the load compensation circuit control code values for various output current settings as a function of MSB is shown in FIG. 10. Several compensation curves are shown each corresponding to a different current attenuation. Each curve plots the number of elements (i.e. transistors) that are turned on in the load compensation switch matrix versus MSB value. Curve 140 represents 100% output power; curve 142 represents 75% output power; curve 144 represents 50% output power; curve 146 represents 25% output power; and curve 148 represents 1.5% output power. Note that these curves were determined empirically using actual measurements of test circuits. The data contained in these curves are stored in the load compensation control LUT 124 (FIG. 11), described in more detail infra.

The polynomial equation for the number of transistors turned on as a function of MSB representing the best fit to curve 140 (100% output power) is as follows:

$$N_{ON}(MSB) = \text{INT}(ABS(A_5 \cdot MSB^5 + A_4 \cdot MSB^4 + A_3 \cdot MSB^3 + A_2 \cdot MSB^2 + A_1 \cdot MSB + A_0 + 0.5))$$

wherein $N_{ON}$ represents the number of transistors to be turned on;

MSB represents the MSB value;

The values of the coefficients $A_0$ through $A_5$ are given below in Table 1.

TABLE 1

Coefficient Values

| Coefficient | Value |
|---|---|
| $A_0$ | 48.521 |
| $A_1$ | −0.213 |
| $A_2$ | 0.020 |
| $A_3$ | −2.223e−4 |
| $A_4$ | 8.540e−7 |
| $A_5$ | −1.131e−9 |

Figure 11:
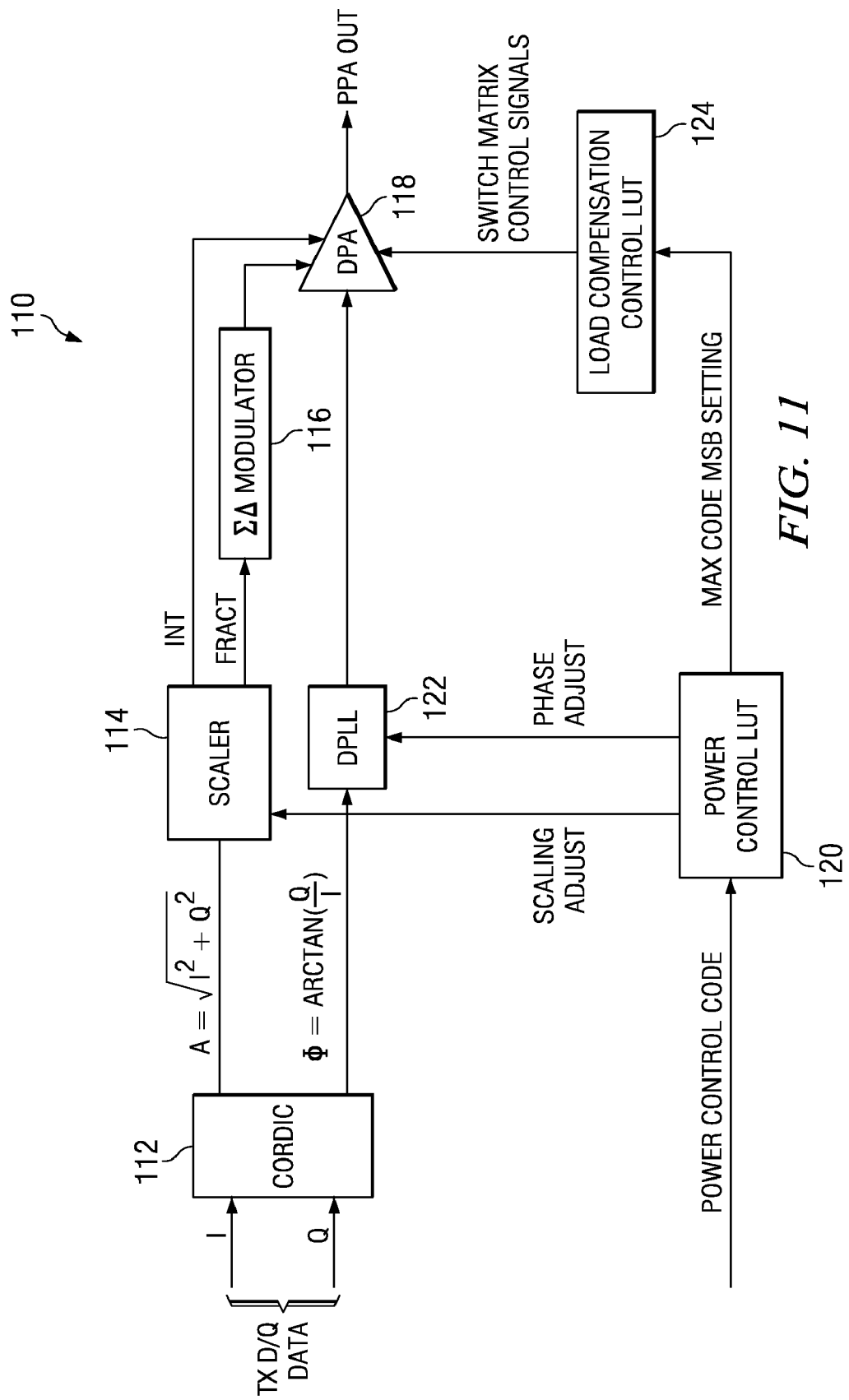
FIG. 11 is a block diagram illustrating an example embodiment of a polar transmitter and DRAC incorporating the digital pre-power amplifier of the present invention with load compensation circuit and power control lookup table.

A block diagram illustrating an example embodiment of a polar transmitter and DRAC incorporating the digital pre-power amplifier of the present invention with load compensation circuit and power control lookup table is shown in FIG. 11. The digital polar transmitter, generally referenced 110, comprises a cordic 112, scaler 114, sigma-delta modulator 116, digital phase locked loop (DPLL) 122, digital power amplifier (DPA) 118, power control circuit 120 and load compensation control LUT 124.

For polar transmission, the I and Q data signals are converted by the cordic into amplitude and phase signals in the polar domain. The amplitude signal undergoes scaling and is split into an integer portion and a fractional portion. The integer portion is input to the DPA and the fractional portion is input to the $\Sigma\Delta$ (sigma-delta) modulator. Sigma-delta modulation is used to enhance the amplitude resolution and to achieve noise spectral shaping. The phase signal is input to the DPLL which incorporates a digitally controlled oscillator (DCO) for upconversion of the input phase signal. The processed amplitude signal and the phase signal output from the DPLL are both input to the DPA. The DPA, incorporating the attenuation circuit of the present invention, functions to combine the integer portion of the digital amplitude, upconverted phase information and output of the sigma-delta modulator into an analog transmit signal.

The power control uses a look up table (LUT) to provide control over the output power generated by the DPA. A power control code determines the amount of output power to be generated. Based on the MSB setting, the load compensation control LUT outputs the switch matrix control signals used by the DPA to generate an impedance appropriate for the particular power level such that the output impedance of the PPA remains substantially constant over the dynamic range of the PPA.

The power control unit 120 provides a scaling adjustment signal that is used by the scaler, a phase adjustment signal used by the DPLL and the maximum code and MSB setting used by the load compensation control LUT to generate the switch matrix control signals that determine the number of elements on or off in the switch matrix. Note that the contents of the power control LUT are defined from a full modulation sweep at each possible power step. The PPA is operative to output power at certain power steps. Within each power step, a full modulation sweep ranges from a minimum MSB code of 0 through a maximum MSB code of 256.

Figure 12:
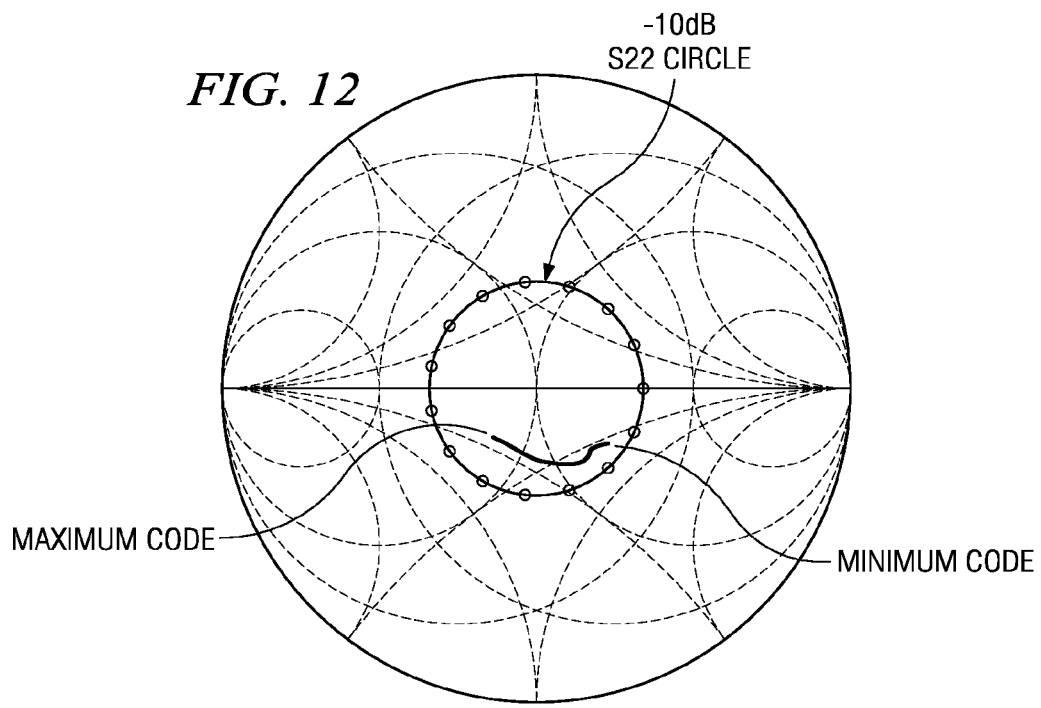
FIG. 12 is a graph illustrating the output impedance of the pre-power amplifier with the load compensation circuit of the present invention.

A graph illustrating the output impedance of the pre-power amplifier with the load compensation circuit of the present invention is shown in FIG. 12. The curve shown represents a sweep of the entire range of PPA codes from minimum output power to maximum output power. The output impedance of the PPA is now within the −10 dB S22 circle throughout the entire output power range.

Figure 13:
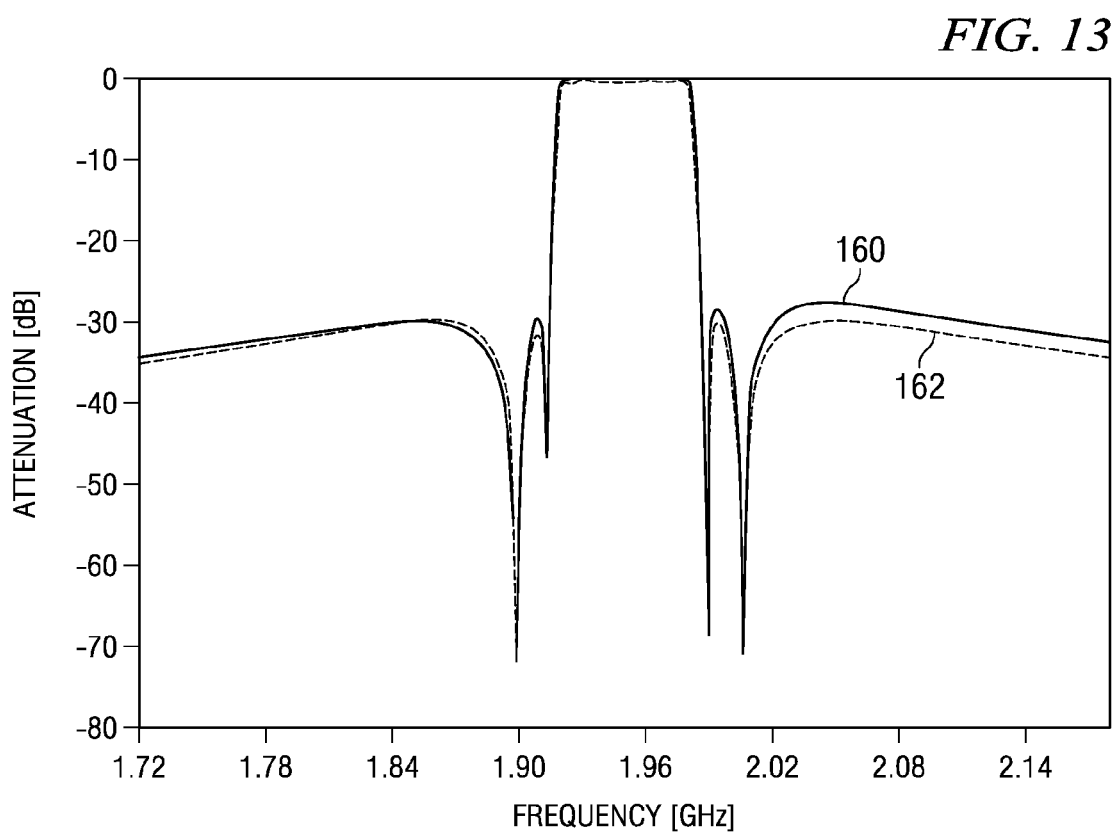
FIG. 13 is a graph illustrating both ideal and load compensated SAW filter attenuation.

A graph illustrating both ideal and load compensated SAW filter attenuation is shown in FIG. 13. With use of the load compensation circuit of the present invention, the load compensated SAW filter attenuation response (trace 162) is very close to the ideal SAW filter attenuation response (trace 160). The load compensated response of FIG. 13 is to be compared with the uncompensated response of FIG. 5 whereby the impedance mismatch causes the attenuation within the pass band to be approximately −8 dB.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A pre-power amplifier, comprising:
    A. load circuitry having an input, an output, and a connection to a first voltage supply lead, the load circuitry including an RF choke connected between the input and the first voltage supply lead, and a DC coupling capacitor connected between the input and the output;
    B. a switch array having a clock input, digital amplitude control inputs, an output connected with the input of the load circuitry, and connections with a second voltage supply lead, the switch array including arrays of transistors, each transistor having a source and a drain connected between the output and the second voltage supply lead and having a gate input coupled with the clock input and a digital amplitude control input, the switch array providing varying impedance to the input of the load circuitry; and
    C. compensation circuitry having control inputs, an output connected with the input of the load circuitry and connections with the second voltage supply, the compensation circuitry including a capacitor having one lead connected to the output of the compensation circuitry and another lead and an array of transistors, each transistor having a source and a drain connected between the other lead of the capacitor and the second voltage supply lead and a gate input connected with a control input.

2. The amplifier of claim 1 in which the first voltage supply lead carries a positive voltage and the second voltage supply lead carries a neutral voltage.

3. The amplifier of claim 1 in which the clock input connects to a digitally controlled oscillator circuitry.

4. The amplifier of claim 1 in which the arrays of transistors includes an MSB matrix of 256 cells and an 8-bit control word, an LSB matrix of 3 cells and a 2-bit control word, and a sigma-delta dithering matrix of 1 cell and 1-bit control word.

5. The amplifier of claim 1 in which few transistors of the switch array are conducting at low output amplitude, resulting in a minimum impedance mis-match corrected by the compensation circuitry, and in which many transistors are conducting at high output amplitude, resulting in a high impedance mismatch corrected by the compensation circuitry.

* * * * *

UNITED STATES PATENT AND TRADEMARK OFFICE
CERTIFICATE OF CORRECTION

| | |
|---|---|
| PATENT NO. | : 7,586,376 B2 |
| APPLICATION NO. | : 11/292965 |
| DATED | : September 8, 2009 |
| INVENTOR(S) | : Petteri M. Litmanen |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 944 days.

Signed and Sealed this

Fourteenth Day of September, 2010

David J. Kappos
*Director of the United States Patent and Trademark Office*